United States Patent [19]

Daems et al.

[11] Patent Number: 5,075,196

[45] Date of Patent: Dec. 24, 1991

[54] HALFTONE IMAGE PRODUCTION

[75] Inventors: Eddie R. Daems; Luc H. Leenders, both of Herentals, Belgium

[73] Assignee: Agfa-Gevaert N.V., Mortsel, Belgium

[21] Appl. No.: 581,123

[22] Filed: Sep. 10, 1990

Related U.S. Application Data

[63] Continuation of Ser. No. 227,316, Aug. 2, 1988, abandoned.

[30] Foreign Application Priority Data

Sep. 1, 1987 [EP] European Pat. Off. ........ 87201655.5

[51] Int. Cl.$^5$ .............................................. G03G 7/00
[52] U.S. Cl. ......................................... 430/202; 430/9; 430/14; 430/15; 430/17; 430/18; 430/538; 430/358; 430/933
[58] Field of Search .................... 430/9, 14, 15, 17, 18, 430/202, 538, 933, 358

[56] References Cited

U.S. PATENT DOCUMENTS 3,642,474  2/1972  Verelst ................................. 430/301
4,657,831  4/1987  Ambro et al. ......................... 430/14

*Primary Examiner*—Charles L. Bowers, Jr.
*Assistant Examiner*—Thorl Chea
*Attorney, Agent, or Firm*—William J. Daniel

[57] ABSTRACT

A halftone dot image pattern is formed on a support comprising a paper base, a polyolefin layer on at least one side of said paper base in a coverage in the range of 5 to 40 g/m2, on the opposite side of the polyolefin layer a binder layer comprising a hydrophilic colloid binding agent and white titanium dioxide pigment particles having an average grain size in the range of 200 nm to 450 nm, said pigment particles being present in a coverage of at least 0.5 g per m2 up to 300% by wt of the total binder contents. The half tone dot image pattern is on the exterior side of the binder layer and is a halftone relief image pattern having at least color pigmented gelatin-containing layer, preferably three or four such layers of different colors; e.g., cyan, magenta, yellow and optionally black. The resultant halftone material has a controlled visual appearance; e.g., for color proofing purposes, especially with respect to dot gain.

11 Claims, 1 Drawing Sheet

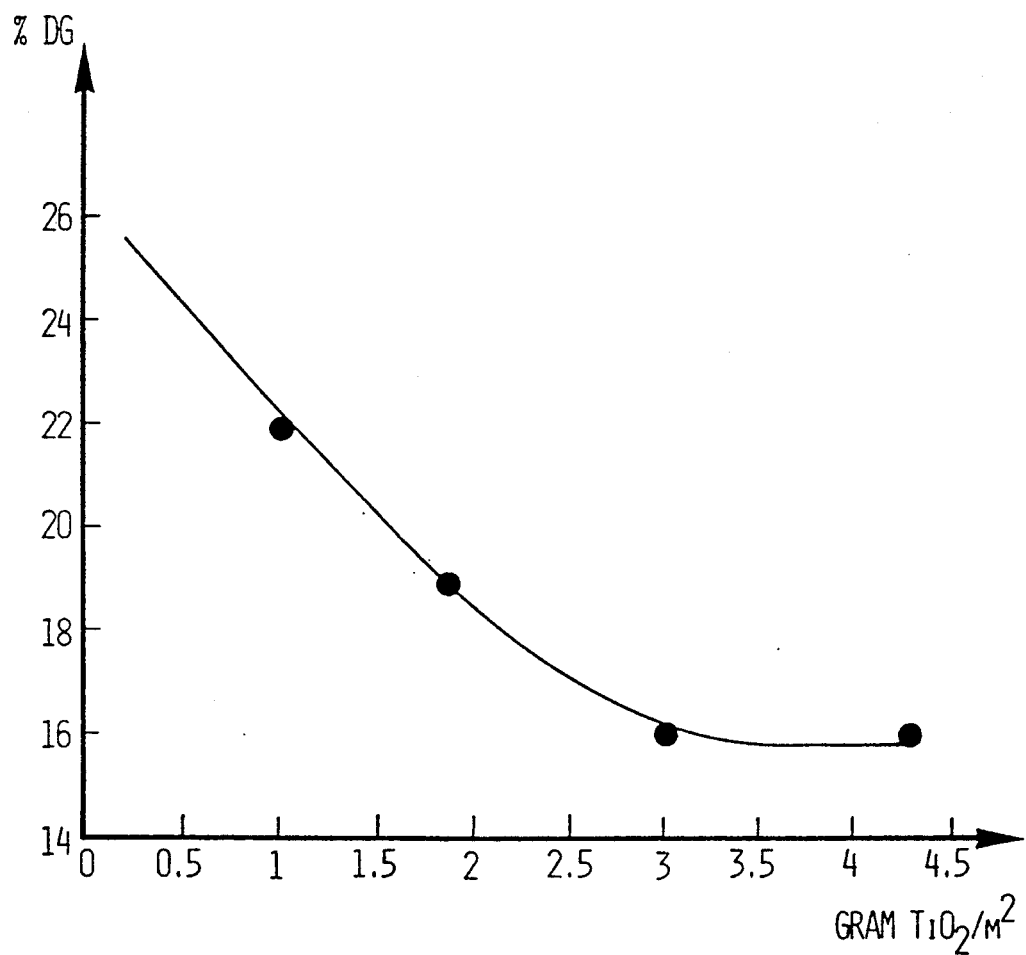

HALFTONE IMAGE PRODUCTION

This application is a continuation, of application Ser. No. 07/227,316, filed Aug. 2, 1988, now abandoned.

DESCRIPTION

The present invention relates to a process for the production of halftone patterns, particularly multicolour colloid patterns on a support providing optical dot gain control.

The production of linework or halftone multicolour colloid patterns is of interest in the field of design, e.g. in the production of colour decorative patterns, colour wiring and circuit diagrams, cartography, colour proofing and the preparation of transparencies for transmission projection or opaque prints for overhead projection.

Especially in the colour field of the graphic art there is a great need for a simple and fast technique offering "colour proofs" of high quality and reproducibility.

Photographically produced colour proofs are a substitute for multicolour halftone reproductions as will be produced by successive printing in register with the separate standard inks: magenta, yellow, cyan and black on a conventional printing press.

Press proofing for the production of colour proofs on an actual printing press by preparing a printing plate and running the plate on the press to produce only a few copies as proof of the quality of the halftone separation transparencies used in the plate production is a very expensive procedure and therefore photographic processes have been developed as an alternative to obtain a similar result by means of which the appearance of a print starting from particular colour separation negatives or positives can be judged by the printer and client.

According to a process known from U.S. Pat. No. 3,642,474 the production of such a proof in the form of superposed coloured colloid patterns, proceeds with coloured hydrophilic colloid layers, which are insolubilized in the irradiated portions by means of an active species resulting from the informationwise exposure to active electromagnetic radiation of a photosensitive substance, and comprises the following steps:

(1) transferring a coloured hydrophilic colloid layer comprising the photosensitive substance and a hydrophilic colloid which undergoes a reduction in solubility in water by the action of said active species, from a temporary support, which is more hydrophobic than a permanent support to which said layer has to be transferred, to said permanent support by pressing the latter in the presence of an aqueous liquid against said colloid layer, and removing the temporary support, thus leaving said layer on the permanent support;

(2) exposing the transferred colloid layer in a substantially dry state to actinic electromagnetic radiation, which is modulated according to the information to be recorded, (3) developing the exposed layer by means of an aqueous liquid followed by a wash-off processing removing the unexposed regions resulting in a coloured relief pattern, and repeating the steps (1), (2) and (3) with said hydrophilic colloid layers having a colour as desired to produce superposed coloured colloid patterns on the permanent support.

In this process for producing a multicolour pattern the exposures proceed in registration on the same permanent support which received the unexposed coloured hardenable colloid layers by transfer from a temporary support, each transfer and exposure being followed by hardening development, wash-off processing and a drying step before a next transfer and exposure leading to a further separation colour pattern can be carried out.

In most of the examples of said U.S. Pat. No. 3,642,474 an ultraviolet radiation sensitive iron (III) complex is used which yields iron (II) upon UV-irradiation forming by reaction with hydrogen peroxide hydroxyl radicals that imagewise harden the gelatin binder of each coloured layer. Said iron (III) complex, e.g. ammonium iron (III) oxalate, has a poor photosensitivity in comparison with silver halide which is preferred for use in combination with low intensity exposure sources as are used e.g. in colour scanners operating with an imagewise modulated laser beam.

A process for producing a multicolour pattern using silver halide emulsion materials is described in published European Patent Application No. 0 185 410.

As can be learned from said published EP-A a hardening developable coloured silver halide emulsion layer on a temporary support is imagewise exposed whereupon the layer containing a latent image of exposed silver halide is transferred onto a permanent support and then hardening development and wash-off processing takes place. For obtaining a multicolour print red, green and blue filter exposures representing halftone selection or separation negatives or positives are made on separate silver halide emulsion layers that are complementary in colour (cyan, magenta and yellow). The successive transfer, hardening development and wash-off processing on a same permanent support of these layers yields a subtractive multicolour relief image of at least partly superposed cyan, magenta and yellow relief portions.

In the above processes the wash-off processable coloured hydrophilic colloid layers are transferred from a temporary support onto a permanent support which may or may not carry one or more relief patterns of previously formed colour image(s).

In the photomechanical production of halftone prints there exists a typical phenomenon known as "dot gain" which has to be taken into account in the production of colour proofs which correspond as close as possible to the prints eventually made on the actual press.

As is known a halftone image consists of numerous dots of different areas that are created when a continuous-tone image is photographed through a halftone screen or obtained by halftone modulated scanning exposure. Due to a number of factors—some of which are controllable, others of which are not—each such dot increases in size from the time it is first created on the photographic material serving as an intermediate original in the formation of the printing form until it is finally reproduced as an ink dot in the printing step. If the dot grows (gains in size) more than it should, the colour in the print will be more saturated than it should and true colour would not be obtained for it is dot size dependent.

Dot gain is made up of two components, physical and optical dot gain. Physical or mechanical dot gain is the actual physically measurable enlargement of the dot size which occurs during the printing process wherein individual ink dots become spread or expanded when applied on the printing paper.

Optical dot gain on the other hand results when light penetrates the printing paper in the clear areas, becomes internally scattered therein and is partially absorbed in the ink dots making the dots visually appear larger. Optical dot gain can be influenced by changing the paper stock (see the article "Gaining on Dot Gain" by Johan Strashun in Graphic Arts Montly, January 1985, p. 69).

In offset printing the greatest dot gain occurs in the mid tones, i.e. around the 50 percent dot value. Good colour balance is obtained when all colours have equal dot gain.

In simulating the printing result with a colour proof it is important to obtain a total dot gain in the colour proof as close as possible to the total dot gain obtained eventually in the actual print, whatever the printing stock or printing method may be.

It is an object of the present invention to provide a process for the production of halftone patterns, i.e. images built up by screen dots, on a support which is capable of controlling or influencing optical dot gain.

It is more particularly an object of the present invention to provide a process for the production of halftone multicolour colloid patterns serving as colour proof on a support providing optical dot gain control.

It is a further object of the present invention to provide a sheet or weblike material suited for producing thereon a halftone image, more particularly a material having a multilayer structure adapted to yield in colour proofing of multicolour halftone images an optical dot gain as required for correct simulation of a printed multicolour halftone image.

Other objects and advantages of the present invention will become clear from the following description.

In accordance with the present invention a process for the production of a halftone pattern on a paper base support characterized in that the support comprises a paper base, polyolefin layer on at least one side of the paper base with a coverage in the range of 5 to 40 g/m2, and an exterior binder layer for carrying the halftone pattern, which binder layer comprises a hydrophilic colloid binding agent and white titanium dioxide pigment particles having an average grain size in the range of 200 nm to 450 nm which particles are present with a coverage of at least 0.5 g per m2 up to in a weight percent of at most 300% by weight with respect to the total binder content.

A practically very useful range of titanium dioxide coverage is in the range of 0.5 to 4.5 g per m2.

According to preferred embodiment of the process of the present invention, a halftone multicolour colloid pattern, which may serve as colour proof, is produced on a permanent paper base support having the above characteristics by the steps of:

(1) transferring a substantially non-hardened gelatin silver halide emulsion layer containing coloured pigment particles dispersed therein from a temporary support onto said permanent support which support may carry already a halftone relief image containing coloured hardened gelatin, (2) imagewise exposing the non-hardened gelatin silver halide emulsion layer either before or after step (1), (3) forming by hardening development a halftone image in said transferred silver halide emulsion layer, (4) wash-off processing to remove selectively unhardened portions of the transferred layer, and (5) repeating steps (1), (2) and (3) to form at least partly superposed portions of differently coloured gelatin containing layers.

Polyolefin resins suited for use in the polyolefin layer of the support material used according to the present invention include ethylene homopolymers such as high density polyethylene and low density polyethylene, propylene homopolymers and copolymers of ethylene with one or more copolymerizable monomers. Copolymers preferably do not contain more than 10% by weight of a polymerized monomer other than polymerized ethylene. Examples of copolymerizable monomers include alfa-olefins such as styrene, vinyl stearate, vinyl acetate, acrylic acid, ethyl acrylate, methyl methacrylate, methacrylic acid and diene compounds such as butadiene and isoprene.

The titanium dioxide may be either of the rutile type or anatase type and may be treated with an inorganic material and/or a polyhydric alcohol examples of which are described in U.S. Pat. No. 4,443,535.

The hydrophilic colloid binding agent is preferably a hydrophilic colloid such as gelatin and is preferably used in combination with a hydrophobic polymer in latex form, the hydrophobic polymer providing good adhesion of the titanium dioxide containing layer to the hydrophobic polyolefin layer upon its coalescence during drying. A particularly useful latex polymer is copoly(methylmethacrylate-1,3 butadiene (50/50 by weight) having a glass transition temperature (Tg) of 10° C. The gelatin and latex polymer solids are preferably used in a weight ratio range of 1:5 to 5:1. The gelatin of the pigment-binder layer may be uniformly pre-hardened to some extent with a classical hardening agent therefor, e.g. formaldehyde.

The white titanium dioxide pigment particles may be used in combination with minor amounts of matting particles, e.g. a matting agent on the basis of hard polymethylacrylate beads having an average particle size of 2 to 5 micrometer and/or Alpha-quartz particles having an average particle size of 0.5 to 3 micrometer.

In the accompanying drawing a graph illustrates the percent dot gain (% DG) as a function of the content of white titanium dioxide (g/m2) in a hydrophilic colloid binder layer applied on a polyethylene coated paper support according to the present invention.

In said graph dot gain for a halftone coloured colloid pattern obtained as described in Example 1 is plotted as percentage dot size increase at 50 percent dot value at 150 lines per 2.54 cm (inch) in the ordinate versus the coverage of titanium dioxide in g/m2 in the abscissa. Details about dot gain determination are given at the end of Example 1.

In a particular embodiment of the process according to the present invention, in the preparation of superposed multicolour patterns photographic materials are used which comprise on a temporary hydrophobic resin support carrying a silver halide emulsion layer incorporating substantially unhardened gelatin as binder, a silver halide hardening (tanning) developing agent, photosensitive silver halide grains and pigments providing the desired colour. The unhardened gelatin is e.g. of the type described in U.S. Pat. No. 3,364,024.

The pigments or dyes are preferably used in diffusion-resistant or nondiffusing form and can have all kinds of colour, e.g. are cyan, light-cyan, magenta, warm magenta, black, yellow, green, brown, orange, red, white or blue. Also to be considered are metallic colours such as pale gold, rich gold, copper, and silver. In other words the term "colour" in the present invention encompasses the use of all pure and mixed colours as well as black and white.

In the production of superposed multicolour colloid patterns used in colour proofing the pigments have to match with the absorption spectrum of the standard process inks as close as possible. Information about standard colour inks can be found in H. M. Cartwright—Ilford Graphic Arts Manual (1962) Vol. I—pages 502 to 504.

In the production of colour proofs the dyes used in the coloured layers are selected to correspond in spectral properties as close as possible to the colour of the printing inks, which for letterpress printing have colour tones as defined in DIN 16538 and for offset printing the colour tones defined in DIN 16539. Further information about colour tones can be found for the U.S.A. in the GATF-Colour Charts. It has been found experimentally that pigments, which are insoluble or very poorly soluble in water and in organic liquids of the alcohol or polyhydric alcohol type, e.g. glycerol, fulfil the requirements of resistance to diffusion. For colour proofing purposes a hardenable colloid layer in the present photographic material should preferably contain said pigments in a concentration sufficiently high for obtaining an optical density of at least 0.35 in the wavelength range of maximum absorption.

Pigments particularly suitable for use in the present invention are known organic non-migratory pigment type dyes, e.g. obtainable under the Trade Marks "HELIO-echt", "PIGMOSOL" and "COLANYL" dyes. "HELIO-echt", "PIGMOSOL" and "COLANYL" are diffusion resistant organic pigments that can be dispersed in aqueous medium with the aid of a dispersing agent. These pigments excel in resistance to light, heat, acids, bases, oxidizing agents, and solvents. They are insoluble in hydrophilic colloids such as gelatin.

When in addition to cyan, magenta and yellow relief patterns a black relief pattern is formed in colour proofing, preferably carbon black is used. Apart from carbon black mixtures of coloured pigments may be applied as described e.g. in U.S. Pat. No. 4,427,757.

In order to obtain images with a good resolution, relatively thin hardenable coloured gelatin containing coatings are used. Preferably such coatings having a thickness in the range of 1 $\mu$m and 15 $\mu$m are used and good results are obtained with pigment coloured layers containing 1 to 10 g of gelatin per sq.m.

Very good results from the viewpoint of image sharpness and mutual adherence of the differently coloured relief portions are obtained with a composite layer structure of a pigmented gelatin layer containing silver halide coated in combination with a non-pigmented gelatin top layer having a combined thickness preferably in the range of 1 to 3 micrometer. The thickness of the pigmented gelatin silver halide emulsion layer is preferably twice that of the non-pigmented gelatin layer. The total gelatin coverage of said composite layer structure is preferably in the range of 1.0 to 3 g of gelatin per sq.m. The pigmented gelatin containing silver halide emulsion layer contains preferably at least 50% by weight of gelatin.

The adhering power of said composite layer structure to its temporary support, preferably a flexible one, should be such that an easy stripping off from the temporary support is possible after pressing said composite layer structure into contact with a wetted permanent support constructed according to the present invention. The temporary support is e.g. an unsubbed cellulose triacetate sheet, a polystyrene sheet or a sheet of copoly(vinyl acetate/vinylchloride). Other temporary supports having a repelling power for wet gelatin coatings are, e.g. a paper base coated with a polyethylene layer, a paper base impregnated with wax, a paper base coated with a layer of cellulose nitrate or a paper base coated with a layer of insolubilized polyvinyl alcohol or a layer of alginic acid insolubilized with an alkaline earth metal salt.

The photosensitive silver halide used in the silver halide emulsion layers of the photographic material used according to the present invention is e.g. silver chloride, silver bromide, silver bromoiodide, silver chlorobromoiodide, or mixtures thereof. The silver halide emulsions may be coarse or fine grain and can be prepared by any of the well known procedures, e.g. as single jet emulsions or double jet emulsions. The silver halide emulsions may be Lippmann emulsions, ammoniacal emulsions, thiocyanate- or thioether-ripened emulsions such as those described in U.S. Pat. Nos. 2,222,264 of Adolph H. Nietz and Frederick J. Russell, issued Nov. 19, 1940, 3,320,069 of Bernard D. Illingsworth, issued May 16, 1967, and 3,271,157 of Clarence E. McBride, issued Sept. 6, 1966. Surface image emulsions may be used or internal image emulsions may be used such as those described in U.S. Pat. Nos. 2,592,250 of Edward Philip Davey and Edward Bowes Knott, issued Apr. 8, 1952, 3,206,313 of Henry D. Porter, Thomas H. James and Wesley G. Lowe, issued Sept. 14, 1965, and 3,447,927 of Robert E. Bacon and Jean F. Barbier, issued June 3, 1969. The emulsions may be tabular grain or regular-grain emulsions such as those of the type described by Klein and Moisar in J. Photogr. Sci., Vol. 12, No. 5, September/October 1964, pp. 242–251. If desired, mixtures of surface and internal image emulsions may be used as described in U.S. Pat. No. 2,996,382 of George W. Luckey and John C. Hoppe, issued Aug. 15, 1961.

Apart from negative working silver halide emulsions that are preferred for their high light sensitivity, direct positive silver halide emulsions may be used that produce a positive silver image and a corresponding imagewise distribution of developing agent oxidation products during their development. For example those direct positive silver halide emulsions are suitable wherein by exposure or by a chemical treatment a developable fog has been produced, which is destroyed imagewise during the imagewise exposure when certain conditions are fulfilled. In the unexposed areas the fog remains so that during the subsequent development a direct positive silver image is obtained and in correspondence therewith an imagewise distribution of oxidized hardening developing agent.

For example, direct positive emulsions of the type described in P. J. Hillson, U.S. Pat. No. 3,062,651, may be utilized to obtain direct positive images. In emulsions of this type, a nonhardening fogging agent such as stannous chloride, formamidine sulfinic acid, or the like is used.

More details about composition, preparation and coating of silver halide emulsions are described, e.g., in Product Licensing Index, Vol. 92, December 1971, publication 9232, p. 107–109 and Research Disclosure, of December 1978, publication 17643.

The silver halide emulsions can be chemically sensitized, e.g. by adding sulphur-containing compounds, e.g. allyl isothiocyanate, allyl thiourea, sodium thiosulphate and the like, during the chemical ripening stage. Also reducing agents, e.g. the tin compounds described in the Belgian Patent Specifications Nos. 493,464 and 568,687, and polyamines such as diethylenetriamine or derivatives of aminomethane-sulphonic acid, e.g. according to the Belgian Patent Specification No. 547,323, can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Further it is possible to sensitize the emulsions with polyalkylene oxide derivatives, e.g. with polyethylene oxide having a molecular weight between 1000 and 20,000, or with condensation products of alkylene oxides and aliphatic alcohols, glycols, cyclic dehydration products of hexitols, alkyl substituted phenols, aliphatic carboxylic acids, aliphatic amines, aliphatic diamines and amides. The condensation products have a molecular weight of at least 700, preferably of more than 1000. For obtaining special effects these sensitizers of course can be combined with each other as described in Belgian Patent Specification No. 537,278 and UK Patent Specification No. 727,982.

For proper spectral sensitization, e.g. with respect to laser beam light, the usual mono- or polymethine dyes such as acidic or basic cyanines, hemicyanines, oxonols, hemioxonols, styryl dyes or others, also tri- or polynuclear methine dyes, e.g. rhodacyanines or neocyanines may be used. Such spectral sensitizers are described, e.g., by F. M. HAMER in "The Cyanine Dyes and Related Compounds" (1964) Interscience Publishers, John Wiley & Sons, New York.

The silver halide emulsions may contain the usual stabilizers, e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxyl or amino groups. Compounds of this kind are described by BIRR in Z. Wiss. Photogr. Photophys. Photochem. 47, 2–27 (1952). Still other suitable stabilizers are amongst others heterocyclic mercapto compounds, e.g. phenylmercaptotetrazole, quaternary benzothiazole derivatives and benzotriazole.

The hardening development of a latent silver image proceeds with commonly used hardening developing agents, also called tanning developing agents for effecting the development of the silver halide and producing oxidized developing agent acting as hardening agent for gelatin. Suitable hardening developing agents are: 1,4-dihydroxy benzene compounds such as hydroquinone, chlorohydroquinone, bromohydroquinone, toluhydroquinone, morpholinemethyl hydroquinone and sulfohydroquinone.

The developing agent(s) may be incorporated in the photographic silver halide material and/or in a developing bath. When incorporated in the photographic material such agent may be present in the silver halide emulsion layer or in a waterpermeable non-silver halide containing layer subjacent thereto so that development can be attained by using an alkaline activator liquid.

According to a special embodiment a hydrophilic gelatin layer containing photosensitive silver halide and coloured pigment particles is combined with an underlying additional layer containing an auxiliary developing agent forming a superadditive developing system with a hardening developing agent present in an overlying silver halide emulsion layer. In said embodiment the development is carried out with a so-called activator liquid being an aqueous alkaline solution free from developing agents.

Typical activator liquids for a hardening developable photographic silver halide emulsion material comprise, for example, an aqueous solution of an alkaline material, such as sodium carbonate, sodium hydroxide, potassium carbonate, potassium hydroxide, mixtures of sodium hydroxide and sodium sulfite, organic alkaline substance, e.g. alkanolamines, etc. A suitable activator bath comprises e.g. about 2 percent by weight of sodium hydroxide and 0.5 percent by weight of sodium sulfite.

Typical auxiliary developing agents include 3-pyrazolidinone developing agents, e.g. 1-phenyl-3-pyrazolidinone, 1-phenyl-4,4-dimethyl-3-pyrazolidinone, 1-phenyl-4-methyl-4'-hydroxymethyl-3-pyrazolidinone and N-methyl-p-aminophenol sulphate.

Said auxiliary developing agents or a mixture thereof may be incorporated in the photographic material and/or in the developing liquid in which the hardening developing agent may be absent when using an alkaline activator bath.

In order to obtain more bright and colour-pure images in the final relief images it is necessary to apply a bleachfix treatment to remove image silver after the development step.

A detailed description is hereinafter set forth of a composition and structure of a coloured light-sensitive silver halide material and its use in the production of a multicolour image according to an embodiment of the present invention.

A coating composition is prepared containing gelatin dissolved in water wherein at least one selected pigment is dispersed in a concentration to yield after coating and drying a layer having an optical density in the wavelength range of maximal absorption of at least 0.35. The coating composition contains preferably at least 50% by weight of gelatin with respect to the pigment particles, optionally a plasticizing agent and a water attracting or humectant compound, e.g. glycerol to give the coating a sufficient adherence to its temporary support while permitting an easy wet (aqueous) stripping off from the temporary support.

The said coating contains preferably 1 to 10 g of gelatin per m2.

On said silver halide emulsion layer a top layer free from pigments is coated preferably. Said top layer preferably contains 0.2 to 2.5 g of gelatin per m2.

The top layer and underlying layer firmly bind together and form a composite layer structure that can be transferred as a whole from the temporary support to the permanent support.

A set of materials each containing such a composite layer structure of different colour is preferably used for preparing a multicolour image. For colour proofing a usual set contains yellow, magenta, cyan, and black pigment coatings on separate cellulose triacetate supports.

According to one embodiment in the production of colour proofs the imagewise exposure of the pigmented silver halide emulsion layer makes use of in a vacuum frame with the particular halftone separation negative or positive of the multicolour pattern to be reproduced in contact with the coloured colloid layer on the permanent support.

According to an other embodiment the image-wise exposure to create screen dots is made scanning-wise, e.g. in a commercial colour scanner on the permanent or temporary support.

Colour scanners operate with a rotating scanner drum and usually with a laser light source of a definite narrow spectral composition. Therefore, scanningwise exposure requires photographic materials with a specific spectral photosensitivity and in order to have a more economic application requires a continuous sequence of exposure and processing steps such that the scanner can operate without interruptions caused by processing.

In a preferred scanningwise exposure called "a single scan operation" the exposure of all the differently coloured hardening developable photographic materials comprising a temporary support carrying a silver halide emulsion layer proceeds on the same scanner drum by arranging the materials on the drum in adjacent order and effecting the scanning without interrupting the rotation of the drum.

From the viewpoint of image-sharpness the best results are obtained by effecting the scanningwise exposure of the light-sensitive silver halide from the front side, instead of through a transparent temporary support. Such requires, however, a reverse reading exposure to obtain right reading copies after transfer of the composite layer structure onto the permanent support. In modern computer-controlled scanner exposure apparatus such does not form a problem since the computer software allows electronic image-reversing without special optics such as mirrors and the like.

The transfer of the imagewise hardenable silver halide emulsion layer, or composite layer including such emulsion layer, from its temporary support to a permanent support can be carried out in an apparatus, in which the materials involved are pressed together between rollers in the presence of an aqueous liquid and the temporary support peeled off.

The imagewise exposure and the hardening development step are followed by a bleach-fixing step in order to obtain pure colours, wherein silver metal is bleached and residual unexposed silver halide is removed. The nonhardened portions of the hardening developed layers on the permanent support are washed off without mechanical rubbing by means of running water at a temperature preferably between 35° and 50° C. Excess of liquid is preferably removed by squeezing the relief resultant on its support between two smooth soft rollers, e.g. rubber rollers.

In a preferred procedure a multicolour image, e.g. multicolour printing proof, is made according to the principles of subtractive colour photography starting with the production as the first relief image of a cyan part image of the multicolour original. In successive order a magenta, yellow and black relief image is produced on the same support. However, the order wherein the colour relief images are made can be chosen arbitrarily.

In a particular case of forming a multicolour image the initial colored layer is applied from a coating solution in unexposed state directly on the permanent support and dried thereon before its exposure and imagewise hardening to form a initial direct reading relief image that is covered with other hardening developable silver halide emulsion layers wherein in their turn the unhardened portions are washed off after their imagewise exposure and hardening development.

The final multicolour relief can be protected by a transparent resin topcoat, which according to a preferred embodiment is applied by spraying a solution of film forming resin onto the relief and drying. A suitable "spray-cover" consists of polyisobutyl methacrylate.

The production of multicolour images of different dot gain on different permanent supports used according to the present invention is illustrated in more detail in the following examples. The percentages and ratios are by weight if not otherwise indicated.

EXAMPLE 1

Preparation of photographic material with temporary support

On a temporary support of unsubbed cellulose triacetate provided at the rear side with a black anti-halation layer and having a thickness of 0.1 mm the following layers were applied in the order given:

(i) a silver chlorobromide-iodide emulsion (molar ratio 83.6/16/0.4) containing diffusion-resistant cyan coloured pigment and having a silver halide coverage equivalent with 0.25 g of silver per sq.m. and gelatin coverage of 1.8 g per sq.m. The emulsion was spectrally sensitized for argon ion laser light. The cyan pigment was FLEXONYL BLUE Paste (C.I. Index Nr. 74,160) which was applied at 6.3 g per liter of coating composition corresponding with 0.126 g of pigment solid per m2. The pH of the coating composition was 5.0; and (ii) a non pigmented gelatin binder layer containing per sq.m. 0.7 g of gelatin, 0.066 g of hydroquinone and 0.095 g of matting agent on the basis of silica particles coated with urea formaldehyde resin.

Magenta, yellow and black pigment coatings were applied to unsubbed cellulose triacetate temporary supports in the same way as defined for the cyan pigmented coating above. The magenta pigment was used as a paste sold under the name HELIOECHTCARMIN BB TEIG (Colour Index Nr. 12,485) and the yellow pigment was used as a paste sold under the name HELIO-ECHTGELB GRN 7476 Feinteig (Colour Index Nr. 21,100). Said pigment-pastes were used in an amount of 14.5 g and 17.6 g respectively per liter of coating composition. In the black pigment coating a carbon black paste was incorporated in admixture with the above mentioned FLEXONYL BLUE-paste in an amount of 15.75 g and 1.26 g respectively per liter of coating composition.

Preparation of the permanent supports with medium, high and low dot gain, which are identified respectively as SM, SH and SL Support SM (for medium dot gain)

A double-side polyethylene coated paper with paper weight of 180 g/m2 and a polyethylene layer weight of 30 g per m2 was air-knife coated at a wet coverage of 55 g per m2 with the following coating composition:

| | |
|---|---|
| distilled water | 300 ml |
| gelatin | 19.8 g |
| 20% aqueous latex of copoly(methylmethacrylate-butadiene) (50/50) | 151 g |
| aqueous dispersion containing 2.86% of polymethylmethacrylate and 9.5% of gelatin | 25.5 g |
| 21.4% aqueous dispersion of TiO$_2$ (average grain size 300 nm) containing 5.7% of gelatin | 131 g |

-continued

| | |
|---|---|
| matting agent A | 5.8 g |
| matting agent B | 2.8 g |
| wetting agents of the anionic sulphonated type | 2.8 g |
| as hardening agent a 20% aqueous solution of formaldehyde | 2.2 ml |
| distilled water up to | 1000 ml |

Matting agent A is an aqueous dispersion containing 10.7% of amorphous silica, 6.4% of gelatin and 4.3% of polyethylacrylate latex particles.

Matting agent B is an aqueous dispersion containing 41.8% of Alpha-quartz and 4.2% of gelatin.

The weight % of $TiO_2$ with respect to the total layer composition was 29.5 in the dried layer. The coverage of $TiO_2$ was 1.54 g/m2.

Support SH (for high dot gain)

A double-side polyethylene coated paper with a paper weight 180 g/m2 and a polyethylene layer weight of 30 g per m2 was air-knife coated at a wet coverage of 56 g per m2 with the following coating composition:

| | |
|---|---|
| distilled water | 300 ml |
| gelatin | 23 g |
| 20% aqueous latex of copoly(methylmethacrylate-butadiene) (50/50) | 151 g |
| aqueous dispersion containing 2.86% of polymethylmethacrylate and 9.5% of gelatin | 25 g |
| 21.4% aqueous dispersion of $TiO_2$ (average grain size 300 nm) containing 5.7% of gelatin | 72 g |
| matting agent A as above | 6 g |
| matting agent B as above | 3 g |
| wetting agents of the anionic sulphonated type | 2.9 g |
| as hardening agent a 20% aqueous solution of formaldehyde | 2.2 ml |
| distilled water up to | 1000 ml |

The weight % of $TiO_2$ with respect to the total layer composition was 19.6 in the dried layer. The coverage of $TiO_2$ was 0.86 g/m2.

Support SL (for low dot gain)

A double-side polyethylene coated paper wherein the paper weights 180 g/m2 and each polyethylene layer weights 30 g per m2 was slide-hopper coated (for slide-hopper coating see e.g. DE-OS 2 224 872) at a wet coverage of 55 g per m2 with the following coating composition:

| | |
|---|---|
| distilled water | 199 ml |
| 20% aqueous latex of copoly(methylmethacrylate-butadiene) (50/50) | 151 g |
| aqueous dispersion containing 2.86% of polymethylmethacrylate and 9.5% of gelatin | 25.5 g |
| 21.4% aqueous dispersion of $TiO_2$ (average grain size 300 nm) containing 5.7% of gelatin | 544 g |
| matting agent A as above | 5.8 g |
| matting agent B as above | 2.8 g |
| 11.7% aqueous solution of saponine | 17 ml |
| as hardening agent a 20% aqueous solution of formaldehyde | 2.2 ml |
| distilled water up to | 1000 ml |

The weight % of $TiO_2$ with respect to the total layer composition was 56.3 in the dried layer. The coverage of $TiO_2$ was 6.40 g/m2.

Exposure

The photographic layers on their temporary support were scanningwise halftone exposed on a commercial argon ion laser scanner operating with electronic dot generation.

The four photographic materials containing the differently pigmented coatings, having DIN A4 format, were exposed successively for obtaining the corresponding colour selections.

Transfer

In the exposed state first the cyan pigment containing two-layer composite structure was transferred respectively onto each of a permanent supports SM, SH and SL as described hereinbefore by soaking the permanent support in water for 30 s and then pressing it into contact with layer (ii). By stripping apart the temporary support the composite layer structure of layers (i) and (ii) was left on the permanent support and the transferred composite layer was dried.

Hardening development

The transferred composite coating was hardening developed by dipping it for 30 s in an aqueous liquid, called activator bath, having the following composition:

| | |
|---|---|
| potassium hydroxide | 25 g |
| potassium carbonate | 150 g |
| potassium bromide | 0.5 g |
| sodium sulphite | 2.0 g |
| 4(hydroxymethyl)4-methyl-1-phenyl-3-pyrazolidinone | 5.0 g |
| mono sodium salt of ethylenediaminetetra-acetic acid | 1.0 g |

Bleach-fixing

The developed material was led through a bleach-fix bath containing sodium thiosulphate and the mono sodium, iron(III) salt of ethylenediamine tetra-acetic acid to remove developed silver metal.

Wash-off processing

To obtain a cyan coloured relief image the hardening developed and bleach-fix processed material was wash-off processed with a warm (40° C.) water spray. The relief image was dried.

The percentage dot gain with respect to the original dots obtained at 50% dot value on permanent support materials SM, SH and SL was with respect to a non-pigment coated polyethylene paper support respectively 17, 21, and 12%.

The halftone dot area percentage was calculated with the Murray-Davies equation (ref. Murray A., "Monochrome Reproduction in Photoengraving", J. Franklin Institute, vol. 221, p. 721-744, reading as follows:

$$a = \frac{1 - 10^{-D_t}}{1 - 10^{-D_s}} \times 100$$

wherein:

$D_t$ represents the density of the halftone tint,
$D_s$ represents the density of the solid, and
a represents the halftone dot area percentage.

The dot gain is obtained by subtracting the dot area percentage of the original halftone separation image from the above calculated one obtained on the titanium dioxide coated paper supports SL, SM, SH used according to the present invention.

EXAMPLE 2

Preparation of cyan coloured photographic silver halide emulsion layer on temporary support On an unsubbed cellulosetriacetate film having a thickness of 130 um the following layers (i) and (ii) were applied in the order given.

Layer (i) was coated from a coating composition at the indicated coverages:
(1) a silver chlorobromide-iodide emulsion (molar ratio 97.65/2.0/0.35) equivalent with 0.3 g of silver nitrate per m2,
(2) a gelatin layer at 1.4 g per m2,
(3) diffusion-resistant cyan coloured pigment FLEXONYL BLUE paste (C.I. 74,160) at 0.267 g per m2; and Layer (ii) was coated as a non-pigmented gelatin binder layer containing per m2 0.6 g of gelatin, 0.08 g of poly(methyl methacrylate) as a matting agent and a poly(ethyl acrylate) latex at 0.02 g of solids per m2.

Preparation of magenta coloured photographic silver halide emulsion layer on temporary support The preparation was identical to that of the cyan layer described above with the difference that the cyan pigment was replaced by HELIOECHTCARMIN BBN TEIG paste (Colour Index Nr. 12,485) at a coverage of 0.6 g per m2.

Preparation of yellow coloured photographic silver halide emulsion layer on temporary support The preparation was identical to that of the cyan layer described above with the difference that the cyan pigment was replaced by HELIOECHTGELB GRN 7476 Feinteig paste (Colour Index Nr. 21,100) at a coverage of 0.467 g per m2.

Preparation of black photographic silver halide emulsion layer on temporary support The preparation was identical to that of the cyan layer described above with the difference that the cyan pigment was used at a coverage of 0.058 g per m2 in combination with HELIOECHTPAPIERSCHWARZ NL-paste at a coverage of 0.486 g per m2.

Preparation of the permanent supports SM, SH and SL

These supports were prepared as described in Example 1.

Transfer

The light-sensitive cyan-coloured composite layer structure (i) and (ii) in their unexposed state was transferred using a pair of pressure rollers onto each of permanent supports SM, SH and SL as described hereinbefore by soaking the permanent support prior to transfer in water. By stripping apart the temporary support said composite layer structure was left on the permanent support and the transferred composite layer was dried in a hot air stream.

Exposure

In a contact-exposure apparatus provided with an ultraviolet radiation source the transferred layer structure was exposed through the proper halftone separation negative.

Hardening development

The transferred composite coating was hardening developed by dipping it for 30 s in an aqueous liquid containing per liter:

| | |
|---|---|
| potassium hydroxide | 20 g |
| potassium carbonate | 200 g |
| potassium bromide | 0.5 g |
| sodium sulphite | 5.0 g |
| 4(hydroxymethyl)4-methyl-1-phenyl-3-pyrazolidinone | 5.0 g |
| hydroquinone | 3.0 g |
| mono sodium salt of ethylenediaminetetra-acetic acid | 1.0 g |

Bleach-fixing

The developed material was led through a bleach-fix bath containing sodium thiosulphate and the mono sodium, iron(III) salt of ethylenediamine tetra-acetic acid.

Wash-off processing

To obtain a cyan coloured relief image the hardening developed and bleach-fix processed material was wash-off processed with warm water (40° C.) water spray. The relief image was dried.

The percentage dot gain obtained at 50% dot value on the permanent support materials SM, SH and SL with respect to the original dots was respectively 17, 22 and 11%.

Onto the cyan coloured relief pattern on the permanent support, the composite magenta coloured layer structure was transferred, dried, image-wise exposed and processed so as to obtain a magenta coloured relief pattern, and that procedure was repeated for the yellow and black coloured relief patterns respectively to form a complete dot size corrected multi-layer relief colour proof on each permanent support.

We claim:

1. In a process for the production of a halftone dot image pattern by the steps comprising subjecting while carried on one side of a support, a photographically exposed light-sensitive silver halide layer having a latent photographic halftone dot image pattern therein to photographic processing comprising photographic development to create on said support a visible halftone dot image pattern corresponding to said latent photographic image, the improvement wherein said support comprises a paper base, a polyolefin layer on at least one side of said paper base with a coverage in the range of 5 to 40 g/m2, and on the exterior side of said polyolefin layer for carrying the light-sensitive layer a white pigmented binder layer comprising a hydrophilic colloid binding agent and white titanium dioxide pigment particles having an average grain size in the range of 200 nm to 450 nm, said particles being present at a coverage of at least 0.5 g per m2 up to 300% by wt of the total binding agent content.

2. A process for the production of a halftone dot image pattern according to claim 1, wherein the halftone pattern is a halftone multicolour colloid relief pattern created by the steps comprising:
(1) transferring a substantially non-hardened gelatin silver halide emulsion layer containing coloured pigment particles dispersed therein from a temporary support onto the white pigmented binder layer of the support of claim 1, which layer may carry already thereon a halftone relief image containing coloured hardened gelatin.
(2) imagewise exposing the non-hardened gelatin silver halide emulsion layer either before or after said step (1),
(3) forming by hardening photographic development of the exposed regions of said emulsion layer a halftone image therein while the unexposed regions are unhardened, and
(4) wash-off processing to remove selectively said unhardened unexposed regions of the transferred emulsion layer, and (5) repeating steps (1), (2) and (3) to form at least partly superposed regions of at least one differently coloured pigmented gelatin containing layer.

3. The process of claim 1, wherein said light-sensitive layer is a colored light-sensitive hydrophilic colloid silver halide emulsion layer and said emulsion layer is subjected to hardening photographic development to develop and selectively harden the regions corresponding to said latent halftone image therein, and the non-image regions of the thus developed emulsion layer are removed by wash-off processing.

4. A process according to claim 1, wherein the polyolefin layer comprises a polyolefin polymer selected from the group consisting of an ethylene homopolymer, a propylene homopolymer or a copolymer of ethylene containing not more than 10% by weight of styrene, vinyl stearate, vinyl acetate, acrylic acid, ethyl acrylate, methyl methacrylate, methacrylic acid, butadiene or isoprene.

5. A process according to claim 1, wherein the hydrophilic colloid binding agent is gelatin.

6. A process according to claim 1, wherein the gelatin is used in a mixture with a hydrophobic polymer in latex form.

7. A process according to claim 6, wherein the gelatin and latex polymer as solids are used in a weight ratio range of 1:5 to 5:1.

8. A process according to claim 2, wherein the transferred silver halide emulsion layer before or after its transfer is exposed through a halftone separation image of a multicolour original.

9. A process according to claim 2, wherein the transferred silver halide emulsion layer after said hardening photographic development is treated with a bleach-fixing liquid for removing photographically developed image silver and residual silver halide therefrom.

10. A colored halftone material with controlled visual appearance which comprises a paper base support, a polyolefin layer on at least one side of said base support with a coverage in the range of 5 to 40 g/m2, on the side of said polyolefin layer opposite said support, a binder layer comprising a hydrophilic colloid binding agent and white titanium dioxide pigment particles having an average grain size in the range of 200 nm to 450 nm, said white pigment particles being present at a coverage of at least 0.5 g per m2 up to 300% by wt of the total binder content, and on the exterior of said binder layer a halftone relief image having at least one color pigmented gelatin-containing layer.

11. The colored halftone material of claim 10 wherein said halftone relief image is a multi-colored composite relief images having at least two color pigmented gelatin-containing layers in at least partially superposed relation with the color of the respective layers thereof being different.

* * * * *